(12) United States Patent
Truong et al.

(10) Patent No.: US 8,156,411 B2
(45) Date of Patent: Apr. 10, 2012

(54) ERROR CORRECTION OF AN ENCODED MESSAGE

(75) Inventors: Minh P. Truong, Austin, TX (US); Khursheed Hassan, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 825 days.

(21) Appl. No.: 12/266,015

(22) Filed: Nov. 6, 2008

(65) Prior Publication Data
US 2010/0115381 A1    May 6, 2010

(51) Int. Cl.
*H03M 13/00* (2006.01)

(52) U.S. Cl. ..................................................... 714/785

(58) Field of Classification Search .............. 714/758, 714/759, 764, 766, 772, 774, 780–786, 794, 714/799, 820
See application file for complete search history.

(56) References Cited

U.S. PATENT DOCUMENTS

| | | | | |
|---|---|---|---|---|
| 5,905,740 | A * | 5/1999 | Williamson | 714/784 |
| 6,192,497 | B1 | 2/2001 | Yang et al. | |
| 6,279,137 | B1 * | 8/2001 | Poeppelman et al. | 714/781 |
| 6,317,858 | B1 * | 11/2001 | Cameron | 714/785 |
| 6,792,569 | B2 * | 9/2004 | Cox et al. | 714/781 |
| 7,058,876 | B1 * | 6/2006 | Ireland et al. | 714/781 |
| 7,237,183 | B2 | 6/2007 | Xin | |
| 7,467,346 | B2 * | 12/2008 | Hassner et al. | 714/781 |
| 2003/0009723 | A1 * | 1/2003 | Chien | 714/784 |
| 2006/0010363 | A1 | 1/2006 | Marelli et al. | |
| 2008/0072120 | A1 | 3/2008 | Radke | |

OTHER PUBLICATIONS

Chen et al; "Small Area Parallel Chien Search Architectures for Long BCH Codes"; IEEE Transactions on Very Large Scale Integration (VLSI), vol. 12, No. 5, May 2004.
Lin et al; "Error Control Coding, Second Edition" pp. 212-215, 2nd ed. ISBN 0-13-0 42672-5, 1937.

* cited by examiner

*Primary Examiner* — Nadeem Iqbal
(74) *Attorney, Agent, or Firm* — Daniel D. Hill; James L. Clingan, Jr.

(57) ABSTRACT

An encoded message is stored in a first memory. The encoded message is retrieved from the first memory as a retrieved encoded message that may contain an error. Syndromes are generated from the retrieved encoded message. The syndromes are used to determine if the retrieved encoded message has an error. Polynomial coefficients are generated for establishing a polynomial equation having a first number of solutions. The polynomial equation is solved only for a second number of solutions. The first number is greater than the second number. The second number of solutions comprises solutions corresponding to locations in the retrieved encoded message. Each location is corrected in the retrieved encoded message that corresponds to a solution of zero of the polynomial equation. The result is efficient error correction.

20 Claims, 3 Drawing Sheets

ERROR CORRECTION OF AN ENCODED MESSAGE

BACKGROUND

1. Field

This disclosure relates generally to error correction, and more specifically, to error correction of an encoded message.

2. Related Art

Various error correction algorithms have been used to locate and correct bit errors in, for example, a data stream or a memory. Some error correction algorithms, such as for example, a Bose-Chaudhuri-Hocquenghem (BCH) algorithm require substantial time to locate and correct errors, even when implemented in a parallel manner.

The use of multi-level NAND flash memory is becoming more common because of the cost advantage. However, multi-level NAND flash memory is generally less reliable than other types of flash memory. The use of higher order error correction algorithms such as BCH has become important for performing error correction of the multi-level NAND flash memories. However, a high error rate in combination with large blocks of data results in a significant amount of time to locate the errors. The time intensive error correction has to be performed even for a single bit of error.

Therefore, what is needed is a method and apparatus that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
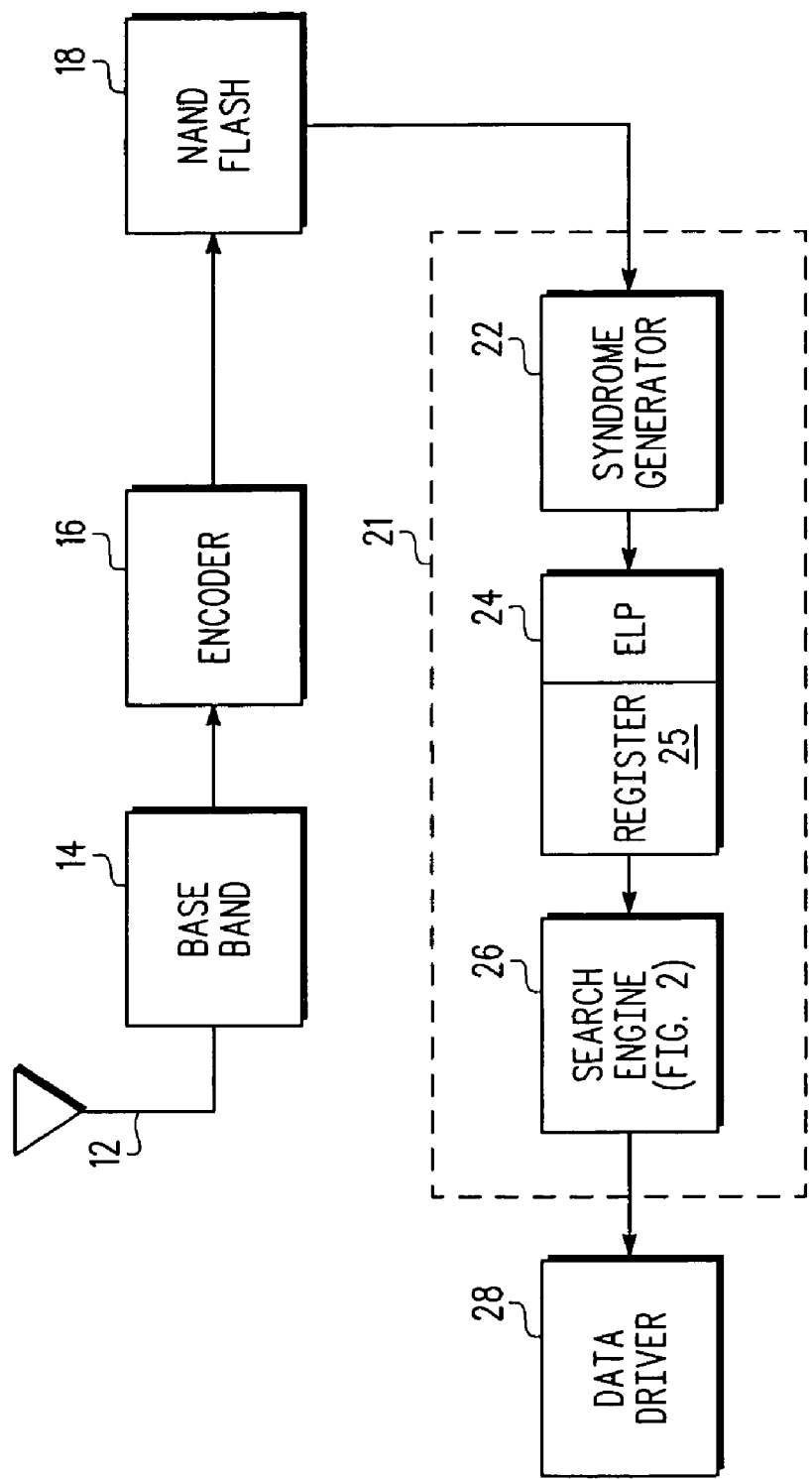
FIG. 1 illustrates, in block diagram form, a system in accordance with an embodiment.

Generally, there is provided, a system and a method for correcting errors in a message or a memory. In one embodiment, the message may be a plurality of bits stored in a memory. In another embodiment the plurality of bits may be a transmitted message over the air. The system includes, in one embodiment, a search engine for determining the locations of errors in an encoded message. The search engine saves clock cycles and layout area by determining that there are no potential solutions for alpha ($\alpha$) in an error location polynomial for bit locations from location zero to location N-n, where N+1 is the number of Galois Field elements, and n is the number of bits of encoded message. Clock cycles are saved by not searching for locations that do not have a solution. In another embodiment, a Chien search algorithm is provided that avoids an inverting step. Avoiding the inverting steps reduces the number of clock cycles, thus reducing the amount of time and power needed correct errors in a message.

In one aspect, there is provided, a method comprising: storing an encoded message in a first memory; retrieving the encoded message from the first memory as a retrieved encoded message that may contain an error; generating syndromes from the retrieved encoded message; using the syndromes to determine if the retrieved encoded message has an error; computing polynomial coefficients for establishing a polynomial equation having a first number of solutions; solving the polynomial equation only for a second number of solutions, wherein: the first number is greater than the second number; and the second number of solutions comprises solutions corresponding to locations in the retrieved encoded message; and correcting each location in the retrieved encoded message that corresponds to a solution of zero of the polynomial equation. The method may further comprise extracting an unencoded message from the retrieved encoded message after the step of correcting. The step of computing the polynomial coefficients may comprise using a Berklekamp table. The method may further comprise storing the polynomial coefficients in a second memory. The steps of computing the polynomial coefficients and storing the polynomial coefficients may be performed in an error location polynomial circuit. The method may further comprise encoding the message to form the encoded message before the step of storing. The step of solving the equation is further characterized as solving a first subset of the second number of solutions in parallel. The step of computing the polynomial coefficients may be further characterized by each solution of the first number of solutions having a corresponding alpha number; and the step of solving the equation occurs in reverse order of the alpha number may continue until all of the second number of solutions have been solved. The first number of solutions may be 32 solutions; and the second number of solutions may be 18 solutions. The method may further comprise outputting the message through a driver circuit.

In another aspect, there is provided, a system, comprising: a memory for storing an encoded message; a syndrome generator coupled to the memory for determining if the encoded message, after having been retrieved from the memory, has errors; an error location polynomial circuit coupled to the syndrome generator for providing polynomial coefficients for an equation useful in determining error locations in the encoded message wherein the equation has a first number of solutions; a search engine coupled to the polynomial circuit for solving only a second number of solutions, wherein the first number is greater than the second number; the second number of solutions comprises solutions corresponding to locations in the retrieved encoded message; a solution of zero in any of the second number of solutions indicates an error at the location in the retrieved encoded message which corresponds to the solution; and the search engine corrects each error indicated by a solution of zero at the location in the retrieved encoded message that corresponds to the solution of zero. The search engine may be further characterized as extracting the message from the retrieved encoded message. The search engine may comprise a Berklekamp table. A set of solutions in the first number of solutions but not included in the second number of solutions may not solved. The error location polynomial circuit further comprises a memory for storing the polynomials. The system may further comprise a data driver coupled to the search engine for outputting the message. The polynomial coefficients may be further characterized by each solution of the first number of solutions having a corresponding alpha number; and the search engine may solve the equation in reverse order of the alpha number and continue until all of the second number of solutions have been solved. The search engine may solve a first subset of the second number of solutions in parallel.

In yet another aspect, there is provided, a system, comprising: a memory for storing an encoded message; a decoder circuit for retrieving the encoded message from the first memory as a retrieved encoded message that may contain an error; a Bose-Chaudhuri-Hocquenghem error correction code circuit, comprising: a syndrome circuit that retrieves syndromes from the retrieved encoded message and determines if at least one error is present in the retrieved encoded message; an error location polynomial circuit for establishing a polynomial equation having a first number of solutions corresponding to a first plurality of alpha numbers of the first number; and a search engine circuit for solving the polynomial equation only for a second number of solutions corresponding to a second plurality of alpha numbers of the second number, wherein the first number is greater than the second number; and the second number of solutions comprises solutions corresponding to locations in the retrieved encoded message; and the search engine corrects each location in the retrieved encoded message that corresponds to a solution of zero of the polynomial equation. The search engine may solve the equation in reverse order of the alpha number and continue until all of the second number of solutions have been solved.

FIG. 1 illustrates, in block diagram form, a system 10 in accordance with an embodiment. In the embodiment of FIG. 1, system 10 is a portion of wireless receiver, such as a receiver implemented as part of a wireless handset in a communication system. In another embodiment, system 10 may be any type of system that processes data and performs error correction of the data. System 10 includes an antenna 12, baseband block 14, encoder 16, NAND flash memory 18, decoder 21, and data driver 28. Decoder 21 includes syndrome 22, error location polynomial (ELP) block 24, and search engine 26. ELP block 24 includes, or is coupled to, registers 25. Antenna 12 is for receiving signals over the air and is coupled to baseband block 14. Note that in another embodiment, antenna 12 can be replaced with another of type of data entry device, such as for example, a keypad, or a memory storing, for example, a digital photo. Baseband block 14 receives the transmitted signals and converts them to baseband. An output of baseband block 14 is coupled to an input of encoder 16, and an output of encoder 16 is coupled to an input of NAND flash 18. NAND flash memory 18 is used to store an encoded message from encoder 16. In one embodiment, NAND flash 18 is a multi-level NAND flash memory. In another embodiment, NAND flash 18 can be any type of volatile or non-volatile memory.

Regarding decoder 21, syndrome generator 22 has an input coupled to the output of NAND flash memory 18, and an output. The syndrome generator determines if the encoded message from NAND flash 18 has any errors using the following equation: $S=(S_1, S_2, \ldots, S_{2t})$ and $Si(x)=\text{remainder}[r(x)/\phi(x)]$ where $r(x)$ is the received message, $\phi(x)$ is the minimal polynomial, i is $1, 2, \ldots, 2t$, and t is the number of errors to be corrected. ELP block 24 has an input coupled to the output of syndrome generator 22, and an output. In one embodiment, ELP 24 includes registers 25 for storing coefficients. In another embodiment, registers 25 may not be used. The ELP 24 provides polynomial coefficients for an equation useful in determining error locations in the encoded message. A berklekamp table may be used to compute the polynomial coefficients. The computed polynomial coefficients may then be stored in register 25. The equation for determining error locations has a first number of solutions. Search engine 26 has an input coupled to the output of ELP 24, and an output coupled to an input of data driver 28. The search engine 26 solves the error equation for only a second number of solutions. As will be discussed below regarding FIG. 2, the second number of solutions may be found in a parallel manner. The first number of solutions is greater than the second number of solutions. The second number of solutions includes solutions corresponding to locations in the encoded message retrieved from NAND flash 18. For any of the second number of solutions that equals zero, an error is indicated at the corresponding location in the retrieved encoded message. After determining the errors, search engine 26 extracts the original message from the retrieved encoded message and provides the original message, free of errors to data driver 28. Data driver 28 may be any type of device or module that outputs or otherwise uses data from search engine 26. For example, in one embodiment, display driver may be a device's display or speaker. In another embodiment, data driver 28 may be, for example, a transmitter.

Figure 2:
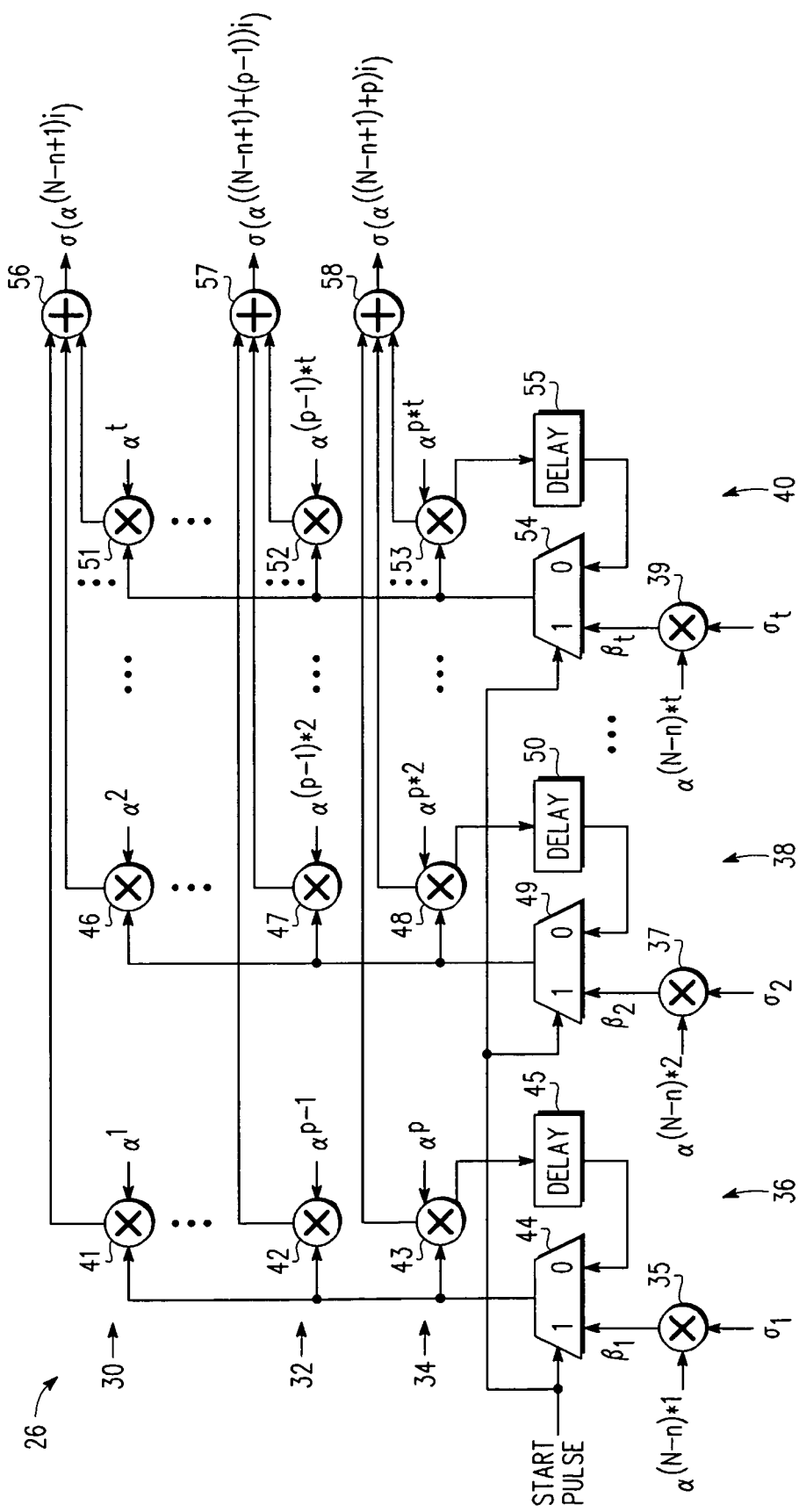
FIG. 2 illustrates, in logic diagram form, a portion of the search engine of FIG. 1 in more detail.

FIG. 2 illustrates, in logic diagram form, a portion of search engine 26 in more detail. Search engine 26 includes multipliers 35, 37, 39, 41, 42, 43, 46, 47, 48, 51, 52, and 53, exclusive OR logic gates 56, 57, and 58, multiplexers 44, 49, and 54, and delay elements 45, 50, and 55. Search engine 26 is organized as a first plurality of parallel paths 30, 32, and 34, and a second plurality of parallel paths 36, 38, and 40. Path 30 includes multipliers 41, 46, and 51 and exclusive OR gate 56. Path 32 includes multipliers 42, 47, and 52 and exclusive OR gate 57, Path 34 includes multipliers 43, 48, and 53 and exclusive OR gate 58. Path 36 includes multiplexer 44, multipliers 35, 41, 42, and 43, and delay element 45. Path 38 includes multiplexer 49, multipliers 37, 46, 47, and 48, and delay element 50. Path 40 includes multiplexer 54, multipliers 39, 51, 52, and 53, and delay element 55.

Search engine 26 implements a Chien search algorithm as modified by the present embodiment. Generally, the modification is used to determine that there are no potential solutions for alpha ($\alpha$) in the ELP from zero to N–n, which means there are no existing bit locations from N to (N–(n–1)), where N+1 is the number of Galois Field elements and n is the number of bits of the encoded message. Therefore, solutions are not calculated for the locations N to (N–(n–1)). Also, the Chien search algorithm has been modified to eliminate the need to invert the solution to correct the error locations. The Chien search algorithm, as modified herein, reduces the number of clock cycles to perform error correction on a plurality of bits, thus saving time and power consumption.

In FIG. 2, a first input of multiplier 35 receives function $\alpha^{(N-n)*1}$, a second input receives $\sigma_1$, and an output provides $\beta_1$ in response. A first input of multiplier 37 receives $\alpha^{(N-n)*2}$, a second input receives $\sigma_2$, and an output provides $\beta_2$. A first input of multiplier 39 receives $\alpha^{(N-n)*t}$, a second input receives $\sigma_t$, and an output provides $\beta_t$, where t is the number of errors the algorithm can correct. A start signal labeled "START PULSE" is provided to the control inputs of multiplexers 44, 49, and 54. Result $\beta_1$ is provided to an input of multipliers 41, 42, and 43. Result $\beta_2$ is provided to an input of multipliers 46, 47, and 48, and result $\beta_t$ is provided to an input of multipliers 51, 52, and 53. On subsequent clock cycles, signal START PULSE is inactive, and the output of multiplier 43 is provided to an input of delay element 45. An output of delay element 45 is provided to a second input of multiplexer 44. An output of multiplier 48 is provided to an input of delay element 50, and an output of delay element 50 is coupled to a second input of multiplexer 49. An output of multiplier 53 is coupled to an input of delay element 55, and an output of delay element 55 is coupled to a second input of multiplexer 54. In path 36, result $\beta_1$ is multiplied with each of $\alpha^1, \alpha^{p-1}$, and $\alpha^p$ and each result is provided to inputs of exclusive OR gates 56, 57, and 58, respectively. Likewise, outputs of each of paths 38 and 40 are provided to exclusive OR gates 57 and 58, where p represents the number of parallel paths.

In a conventional Chien search algorithm for BCH(n,k,t), $$\Lambda(\alpha^i) = \sum_{j=1}^{t} \Lambda_j \alpha^{i*j} + 1$$

for i=0, 1, ..., n−1. In path 30, an output of exclusive OR gate 56 is given by $\sigma(\alpha^{(N-n+1)*i})$ In path 32, an output of exclusive OR gate 57 is given by $\sigma(\alpha^{((N-n+1)+(p-1))i})$. In path 34, an output of exclusive OR gate 58 is given by $\sigma(\alpha^{((N-n+1)+p)i})$ where p is a parallel factor. For BCH(n,k,t) in the illustrated embodiment, let GF($2^m$) and N=$2^m$−1, where $2^m$ is the whole field, n is the number of bits of the encoded message, k is the original message, and t is the number of errors than can be corrected. The α is from 0 to (n−1), so the inverse should be from N to N−(n−1). There are no solutions for α from 0 to (N−n). The illustrated embodiment does not search these locations, thereby saving clock cycles. In one embodiment, the number of possible solutions is 32, but eliminating the locations that have no solutions results in only 18 locations where a solution is computed, thus reducing computation time.

Figure 3:
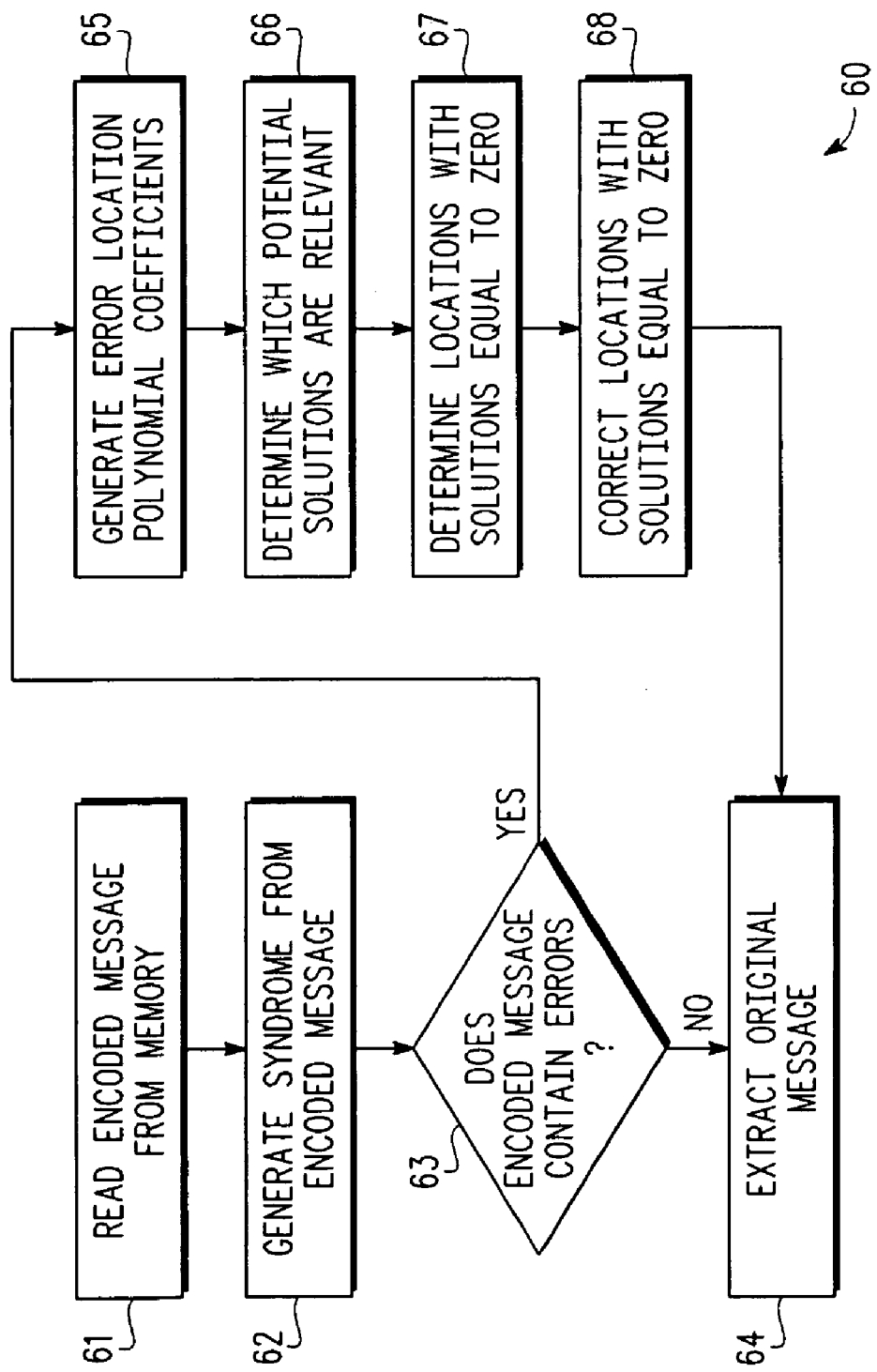
FIG. 3 illustrates a flow chart of a method for determining error locations in a message in accordance with an embodiment.

FIG. 3 illustrates a flow chart of a method 60 for determining error locations in a message in accordance with an embodiment. At step 61, an encoded message including a plurality of bits is read from NAND memory 18. At step 62, a syndrome is generated from the encoded message. At decision step 63, it is determined if the encoded message contains errors. Whether or not the encoded message contains errors is determined by dividing the encoded message by minimal polynomial coefficients and checking the remainder. The minimal polynomial is expressed as $\phi(x)$. If the remainder of the division is equal to zero, the encoded message does not contain errors. If the remainder is not equal to zero, the encoded message contains errors. If the encoded message does not contain errors, the NO path is taken to step 64 and the original message is extracted from the encoded message. If the encoded message does contain errors, the YES path is taken to step 65. At step 65, polynomial coefficients for the error locations are generated using ELD 24. In one embodiment, the polynomial coefficients are computed using a Berklekamp table such as the Berklekamp table below:

| μ | $\sigma^{(\mu)}(X)$ | $d_\mu$ | $l_\mu$ | $2\mu - l_\mu$ |
|---|---|---|---|---|
| −½ | 1 | 1 | 0 | −1 |
| 0 | 1 | $S_1$ | 0 | 0 |
| 1 | — | — | — | — |
| 2 | — | — | — | — |
| t | — | — | — | — |

The variable μ is the μth step of iteration, $d_\mu$ is the μth discrepancy, and $I_\mu$ is the degree of $\sigma^{(\mu)}(X)$. The algorithm is solved by using the following two conditions:
1. If $d_\mu$=0, then $\sigma^{(\mu+1)}(X) = \sigma^{(\mu)}(X)$.
2. If $d_\mu$ is not equal to 0, another row is found preceding the μth row, for example, the ρth, such that the number $2\rho - I_\rho$ in the last column is as large as possible and $d_\rho$ is not equal to 0. Then, $\sigma^{(\mu+1)}(X) = \sigma^{(\mu)}(X) + d_\mu d_\rho^{-1} X^{2(\mu-\rho)} \sigma^{(\rho)}(X)$. In either case, $I_{\mu+1}$ is the degree of $\sigma^{(\mu+1)}(X)$, and the discrepancy at the (μ+1)th step is $d_\mu + 1 = S_{2\mu+3} + \sigma_1^{(\mu+1)} S_{2\mu+2} + \sigma_2^{(\mu+1)} S_{2\mu+1} + \ldots + \sigma_{I\mu+1}^{(\mu+1)} S_{2\mu+3-I\mu+1}$. The polynomial $\sigma(t)(X)$ in the last row should be the required $\sigma(X)$. If its degree is greater than t, there were more than t errors, and generally it is not possible to locate them. The computed coefficients are stored in register 25.

At step 66, it is determined which potential solutions are relevant. In a preferred embodiment, a relevant solution is one that is equal to zero. In another embodiment, a relevant solution is one that is non-zero. In the illustrated embodiment, a relevant solution is one that is equal to zero. At step 67, locations to the solutions that are equal to zero are determined. At step 68, the locations determined in step 67 are assumed to contain errors. The errors are corrected by changing the value of the bits. That is, if an erroneous bit equals zero, than the erroneous bit is changed to have a value of one. At step 64, the original message is extracted from the corrected encoded message.

Using the described modified Chien search algorithm, as described above, reduces the amount of time required to correct errors in an encoded message.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIG. 1 and the discussion thereof describe an exemplary information processing system, this exemplary architecture is presented merely to provide a useful reference in discussing various aspects of the invention. Of course, the description of the system has been simplified for purposes of discussion, and it is just one of many different types of appropriate systems that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the systems depicted herein are merely exemplary, and that in fact many other systems can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of system 10 are circuitry located on a single integrated circuit or within a same device. Alternatively, system 10 may include any number of separate integrated circuits or separate devices interconnected with each other. For example, NAND flash 18 may be located on a same integrated circuit as decoder 21 or on a separate integrated circuit or located within another peripheral or slave discretely separate from other elements of system 10. Also for example, system 10 or portions thereof may be soft or code representations of physical circuitry or of logical representations convertible into physical circuitry. As such, system 10 may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method comprising:
   storing an encoded message in a first memory;
   retrieving the encoded message from the first memory as a retrieved encoded message that may contain an error;
   generating syndromes from the retrieved encoded message;
   using the syndromes to determine if the retrieved encoded message has an error;
   computing polynomial coefficients for establishing a polynomial equation having a first number of solutions;
   solving the polynomial equation only for a second number of solutions, wherein:
     the first number is greater than the second number; and
     the second number of solutions comprises solutions corresponding to locations in the retrieved encoded message; and
   correcting each location in the retrieved encoded message that corresponds to a solution of zero of the polynomial equation.

2. The method of claim 1, further comprising extracting an unencoded message from the retrieved encoded message after the step of correcting.

3. The method of claim 1 wherein the step of computing the polynomial coefficients comprises using a Berklekamp table.

4. The method of claim 1 further comprising storing the polynomial coefficients in a second memory.

5. The method of claim 4 wherein the steps of computing the polynomial coefficients and storing the polynomial coefficients are performed in an error location polynomial circuit.

6. The method of claim 1 further comprising encoding the message to form the encoded message before the step of storing.

7. The method of claim 1 wherein the step of solving the equation is further characterized as solving a first subset of the second number of solutions in parallel.

8. The method of claim 1 wherein:
   the step of computing the polynomial coefficients is further characterized by each solution of the first number of solutions having a corresponding alpha number; and
   the step of solving the equation occurs in reverse order of the alpha number and continues until all of the second number of solutions have been solved.

9. The method of claim 1 wherein:
   the first number of solutions is 32 solutions; and
   the second number of solutions is 18 solutions.

10. The method of claim 1, further comprising outputting the message through a driver circuit.

11. A system, comprising:
    a memory for storing an encoded message;
    a syndrome generator coupled to the memory for determining if the encoded message, after having been retrieved from the memory, has errors;
    an error location polynomial circuit coupled to the syndrome generator for providing polynomial coefficients for an equation useful in determining error locations in the encoded message wherein the equation has a first number of solutions;
    a search engine coupled to the polynomial circuit for solving only a second number of solutions, wherein:
      the first number is greater than the second number;
      the second number of solutions comprises solutions corresponding to locations in the retrieved encoded message;
      a solution of zero in any of the second number of solutions indicates an error at the location in the retrieved encoded message which corresponds to the solution; and
      the search engine corrects each error indicated by a solution of zero at the location in the retrieved encoded message that corresponds to the solution of zero.

12. The system of claim 11, wherein the search engine is further characterized as extracting the message from the retrieved encoded message.

13. The system of claim 12, wherein the error location polynomial circuit comprises a Berklekamp table.

14. The system of claim 11, wherein a set of solutions in the first number of solutions but not included in the second number of solutions are not solved.

15. The system of claim 11, wherein the error location polynomial circuit further comprises a memory for storing the polynomials.

16. The system of claim 11, further comprising a data driver coupled to the search engine for outputting the message.

17. The system of claim 11 wherein:
    the polynomial coefficients are further characterized by each solution of the first number of solutions having a corresponding alpha number; and
    the search engine solves the equation in reverse order of the alpha number and continues until all of the second number of solutions have been solved.

18. The system of claim 11 wherein the search engine solves a first subset of the second number of solutions in parallel.

19. A system, comprising:
a memory for storing an encoded message;
a decoder circuit for retrieving the encoded message from the first memory as a retrieved encoded message that may contain an error;
a Bose-Chaudhuri-Hocquenghem error correction code circuit, comprising:
  a syndrome circuit that retrieves syndromes from the retrieved encoded message and determines if at least one error is present in the retrieved encoded message;
  an error location polynomial circuit for establishing a polynomial equation having a first number of solutions corresponding to a first plurality of alpha numbers of the first number; and
  a search engine circuit for solving the polynomial equation only for a second number of solutions corresponding to a second plurality of alpha numbers of the second number, wherein
    the first number is greater than the second number; and
    the second number of solutions comprises solutions corresponding to locations in the retrieved encoded message; and
    the search engine corrects each location in the retrieved encoded message that corresponds to a solution of zero of the polynomial equation.

20. The system of claim 19, wherein the search engine solves the equation in reverse order of the alpha number and continues until all of the second number of solutions have been solved.

* * * * *